United States Patent
Zheng et al.

(10) Patent No.: US 9,147,408 B1
(45) Date of Patent: Sep. 29, 2015

(54) HEATED AFM LAYER DEPOSITION AND COOLING PROCESS FOR TMR MAGNETIC RECORDING SENSOR WITH HIGH PINNING FIELD

(71) Applicant: Western Digital (Fremont), LLC, Fremont, CA (US)

(72) Inventors: Yuankai Zheng, Fremont, CA (US); Qunwen Leng, Palo Alto, CA (US); Tong Zhao, Fremont, CA (US); Christian Kaiser, San Jose, CA (US); Zhitao Diao, Fremont, CA (US); Xin Jiang, San Jose, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/216,285

(22) Filed: Mar. 17, 2014

Related U.S. Application Data (60) Provisional application No. 61/918,155, filed on Dec. 19, 2013.

(51) Int. Cl.
| | | |
|---|---|---|
| *G11B 5/37* | (2006.01) | |
| *H01F 10/32* | (2006.01) | |

(52) U.S. Cl.
CPC .............. *G11B 5/37* (2013.01); *H01F 10/3268* (2013.01)

(58) Field of Classification Search
CPC .......... G11B 5/37; B82Y 25/00; B82Y 40/00; H01F 10/3268; H01F 41/304
USPC ..................................... 360/324.11
See application file for complete search history.

(56) References Cited

U.S. PATENT DOCUMENTS

| | | |
|---|---|---|
| 5,583,725 A | 12/1996 | Coffey et al. |
| 5,804,250 A | 9/1998 | Yang |
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,491 A | 3/2000 | Lin |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |

(Continued)

OTHER PUBLICATIONS

Yuankai Zheng, U.S. Appl. No. 13/691,729, filed Nov. 30, 2012, 15 pages.

*Primary Examiner* — Angel Castro (57) ABSTRACT

Systems and methods are provided for manufacturing a magnetic recording sensor for use in a magnetic reader, such as a tunneling magnetoresistance (TMR) readers. The magnetic recording sensor can be manufactured by heating a substrate in a first chamber and depositing an antiferromagnetic (AFM) layer on the heated substrate. Additionally, a first pinned layer is added onto the AFM layer, and the substrate is subsequently cooled.

11 Claims, 5 Drawing Sheets

(56) References Cited

U.S. PATENT DOCUMENTS

| | | | |
|---|---|---|---|
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,129,957 A | 10/2000 | Xiao et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,315,839 B1 | 11/2001 | Pinarbasi et al. |
| 6,317,290 B1 | 11/2001 | Wang et al. |
| 6,317,297 B1 | 11/2001 | Tong et al. |
| 6,322,640 B1 | 11/2001 | Xiao et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,388,847 B1 | 5/2002 | Horng et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,413,325 B1 | 7/2002 | Shimazawa et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,015 B2 | 8/2002 | Ju et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,385 B1 | 9/2002 | Shimazawa et al. |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,478,884 B2 | 11/2002 | Shimazawa et al. |
| 6,479,096 B1 | 11/2002 | Shi et al. |
| 6,482,657 B2 | 11/2002 | Shimazawa |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,556,392 B1 | 4/2003 | Mao et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,393 B1 | 10/2003 | Araki et al. |
| 6,636,394 B1 | 10/2003 | Fukagawa et al. |
| 6,639,291 B1 | 10/2003 | Sin et al. |

(56) References Cited

U.S. PATENT DOCUMENTS

| | | |
|---|---|---|
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,700,760 B1 | 3/2004 | Mao |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,724,581 B2 | 4/2004 | Westwood |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,048 B2 | 6/2004 | Li et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,848,169 B2 | 2/2005 | Shin et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,876,507 B2 | 4/2005 | Chen et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 6,998,061 B1 | 2/2006 | Cross |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,150,093 B2 | 12/2006 | Beach |
| 7,154,715 B2 | 12/2006 | Yamanaka et al. |
| 7,166,173 B2 | 1/2007 | Beach |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,252,852 B1 * | 8/2007 | Parkin .......................... 427/131 |
| 7,270,896 B2 | 9/2007 | Parkin |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,320,169 B2 | 1/2008 | Li et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |

(56) References Cited

U.S. PATENT DOCUMENTS

| | | |
|---|---|---|
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,443,639 B2 | 10/2008 | Parkin |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,570,462 B2 | 8/2009 | Lin |
| 7,576,956 B2 | 8/2009 | Huai |
| 7,583,466 B2 | 9/2009 | Kermiche et al. |
| 7,595,967 B1 | 9/2009 | Moon et al. |
| 7,606,010 B2 | 10/2009 | Parkin |
| 7,639,457 B1 | 12/2009 | Chen et al. |
| 7,660,080 B1 | 2/2010 | Liu et al. |
| 7,666,467 B2 | 2/2010 | Parkin |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,807,218 B2 | 10/2010 | Parkin |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,906,231 B2 | 3/2011 | Parkin |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,097 B2 | 8/2011 | Parkin |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |

(56) References Cited

U.S. PATENT DOCUMENTS

| | | |
|---|---|---|
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2002/0030950 A1* | 3/2002 | Sano et al. .............. 360/324.11 |
| 2002/0114113 A1 | 8/2002 | Lederman et al. |
| 2004/0196681 A1 | 10/2004 | Xiao et al. |
| 2006/0003185 A1 | 1/2006 | Parkin |
| 2007/0053114 A1 | 3/2007 | Uesugi et al. |
| 2007/0111332 A1 | 5/2007 | Zhao et al. |
| 2008/0179699 A1 | 7/2008 | Horng et al. |
| 2008/0273375 A1* | 11/2008 | Dahmani et al. .............. 365/158 |
| 2009/0027810 A1 | 1/2009 | Horng et al. |
| 2009/0128944 A1 | 5/2009 | Jang et al. |
| 2010/0290157 A1 | 11/2010 | Zhang et al. |
| 2010/0320076 A1 | 12/2010 | Zhao et al. |

(56) References Cited

U.S. PATENT DOCUMENTS

| | | |
|---|---|---|
| 2011/0032638 A1* | 2/2011 | Arai et al. ............ 360/97.01 |
| 2011/0086240 A1 | 4/2011 | Xiang et al. |
| 2011/0102949 A1 | 5/2011 | Yuan et al. |
| 2011/0151144 A1 | 6/2011 | Arai et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

HEATED AFM LAYER DEPOSITION AND COOLING PROCESS FOR TMR MAGNETIC RECORDING SENSOR WITH HIGH PINNING FIELD

CROSS-REFERENCE TO RELATED APPLICATIONS

This application claims the benefit of U.S. Provisional Application Ser. No. 61/918,155, filed Dec. 19, 2013, which is incorporated herein by reference in its entirety.

BACKGROUND

In magnetic storage devices such as hard disk drives (HDD), read and write heads are used to magnetically read and write information to and from storage media. In a HDD, data may be stored on one or more disks in a series of adjacent concentric circles which may be referred to as data tracks. A HDD may include a rotary actuator, a suspension mounted on an arm of the rotary actuator, and a slider bonded to the suspension to form a head gimbal assembly (HGA). In a traditional HDD, the slider carries a write head and read head, and radially floats over the surface of the storage media, e.g., a disk, under the control of a servo control system that selectively positions a head over a specific track of the disk. In this one read head (reader) configuration, the reader is aligned over the center of a track for data read back.

As HDD storage capacities have increased, the data track separation has decreased and the density has increased. Smaller reader dimensions are required to meet these requirements of increasing track density and linear density. In tunneling magnetoresistance (TMR) readers, for example, this may involve decreasing the volume of the antiferromagnetic (AFM) layer. This reduction in volume reduces the blocking temperature distribution (TbD) and the pinning magnetic field strength ($H_{ex}$) in the TMR reader, thereby worsening the thermal stability of the pinned layer. Accordingly, as the size of the TMR reader decreases, the pinning strength or exchange field needs to be increased to keep the pinned layer stable. Prior processes have focused on heating the AFM layer after its deposition to improve the pinning field. However, this process does not improve the blocking temperature.

BRIEF DESCRIPTION OF THE DRAWINGS

The present application is illustrated by way of example, and not limitation, in the figures of the accompanying drawings in which.

DETAILED DESCRIPTION

In the following description, numerous specific details are set forth to provide a thorough understanding of various embodiment of the present disclosure. It will be apparent to one skilled in the art, however, that these specific details need not be employed to practice various embodiments of the present disclosure. In other instances, well known components or methods have not been described in detail to avoid unnecessarily obscuring various embodiments of the present disclosure.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. By contrast, a first layer "on" a second layer is in contact with that second layer. Additionally, the relative position of one layer with respect to other layers is provided assuming operations are performed relative to a substrate without consideration of the absolute orientation of the substrate.

In accordance with the present disclosure, systems and methods for manufacturing a TMR magnetic recording sensor with a high pinning field are disclosed. In the present disclosure, a substrate may be heated prior to AFM layer deposition. This is in contrast to prior methods and structures, which either manufacture the TMR structure without heating or perform heating after the AFM layer deposition.

Figure 1:
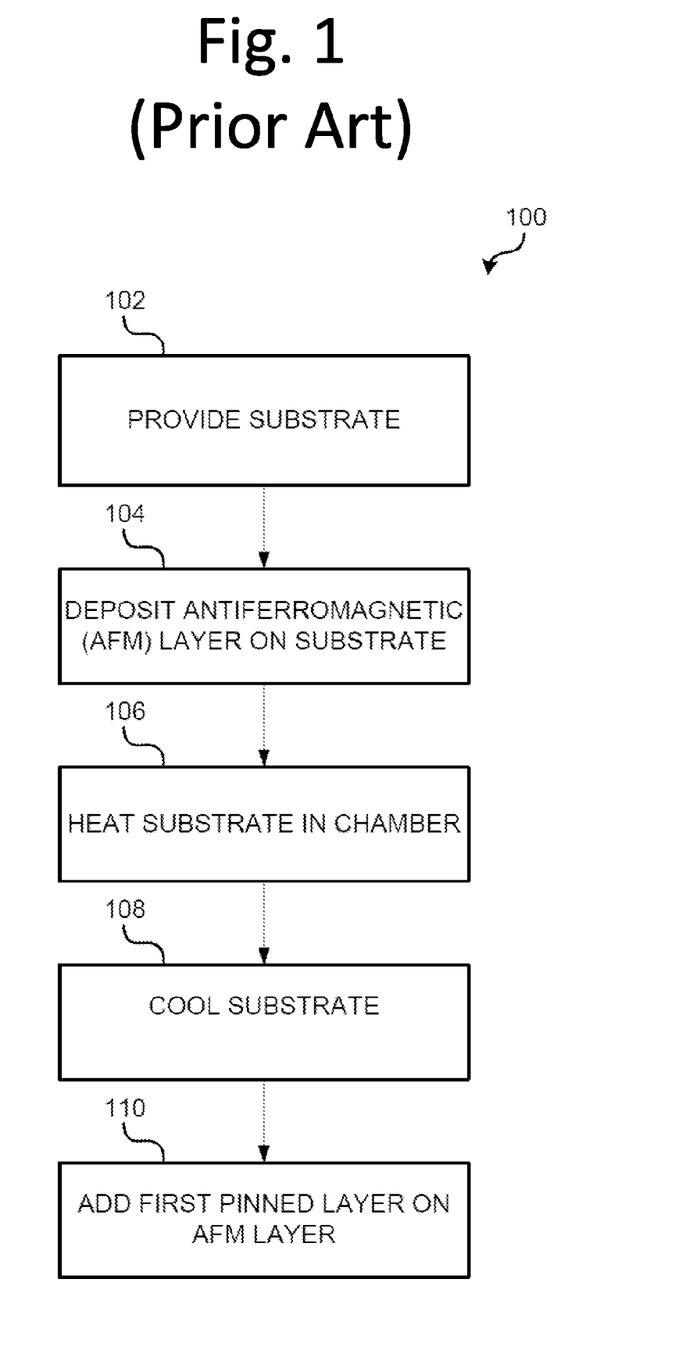
FIG. 1 is an operational flow diagram illustrating an example prior art process for manufacturing a magnetic recording sensor having a conventional structure without a heating/cooling process.

For example, FIG. 1 is an operational flow diagram illustrating an example prior art process for manufacturing a magnetic recording sensor having a conventional structure without a heating/cooling process. Process 100 may begin at operation 102, where a substrate is provided. At operation 104, an AFM layer is then deposited on the substrate. At operation 106, the substrate is heated in a chamber or station of a disk processing system. At operation 108, the substrate is subsequently cooled. At operation 110, a first pinned layer is added onto the AFM layer. When a conventional structure is not heated/cooled at all, a substrate can be provided, an AFM layer may be deposited on the substrate, and a pinned layer can be added onto the AFM layer.

Figure 2:
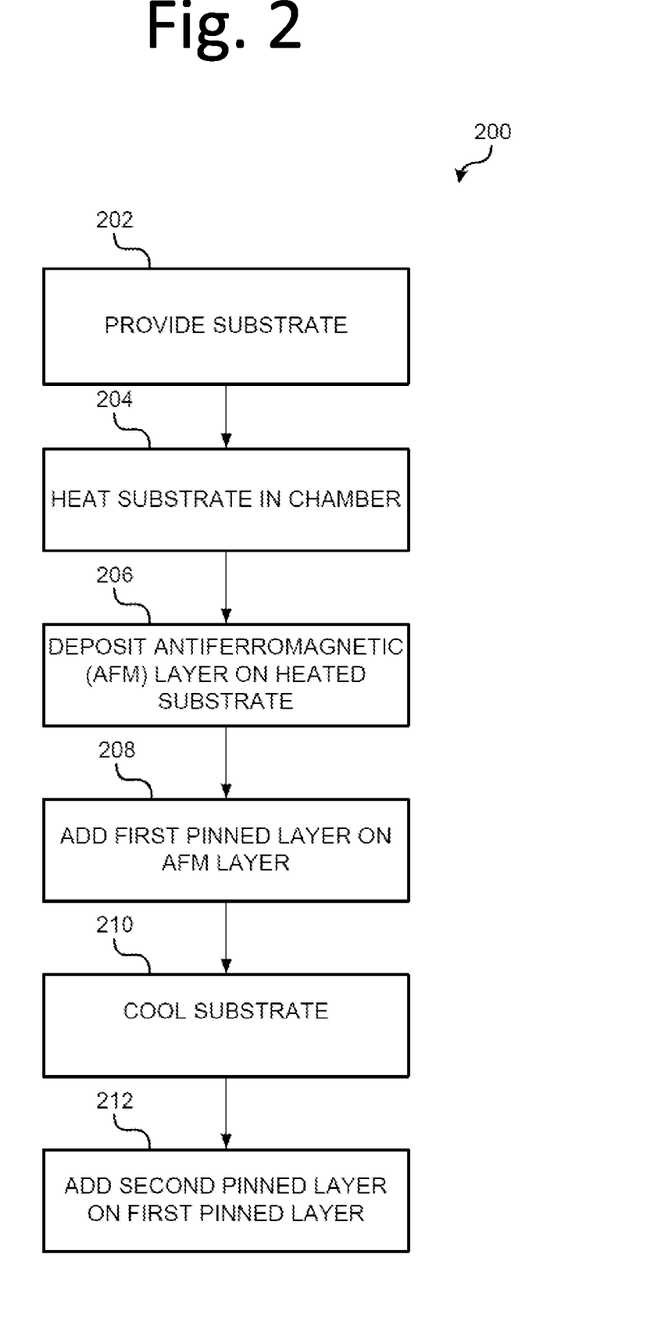
FIG. 2 is an operational flow diagram illustrating an example process for manufacturing a magnetic recording sensor in accordance with various embodiments.

FIG. 2 illustrates an operational flow diagram illustrating an example process 200 for manufacturing a magnetic recording sensor in accordance with various embodiments. Process 200 may begin at operation 202 by providing a substrate. At operation 204, the substrate may be heated in a chamber or station of a disk processing system. At operation 206, an AFM layer may be deposited on the heated substrate. At operation 208, a first pinned layer can be added onto the AFM layer. At operation 210, the substrate can be cooled. At operation 212, a second pinned layer can be added onto the first pinned layer.

Figure 3:
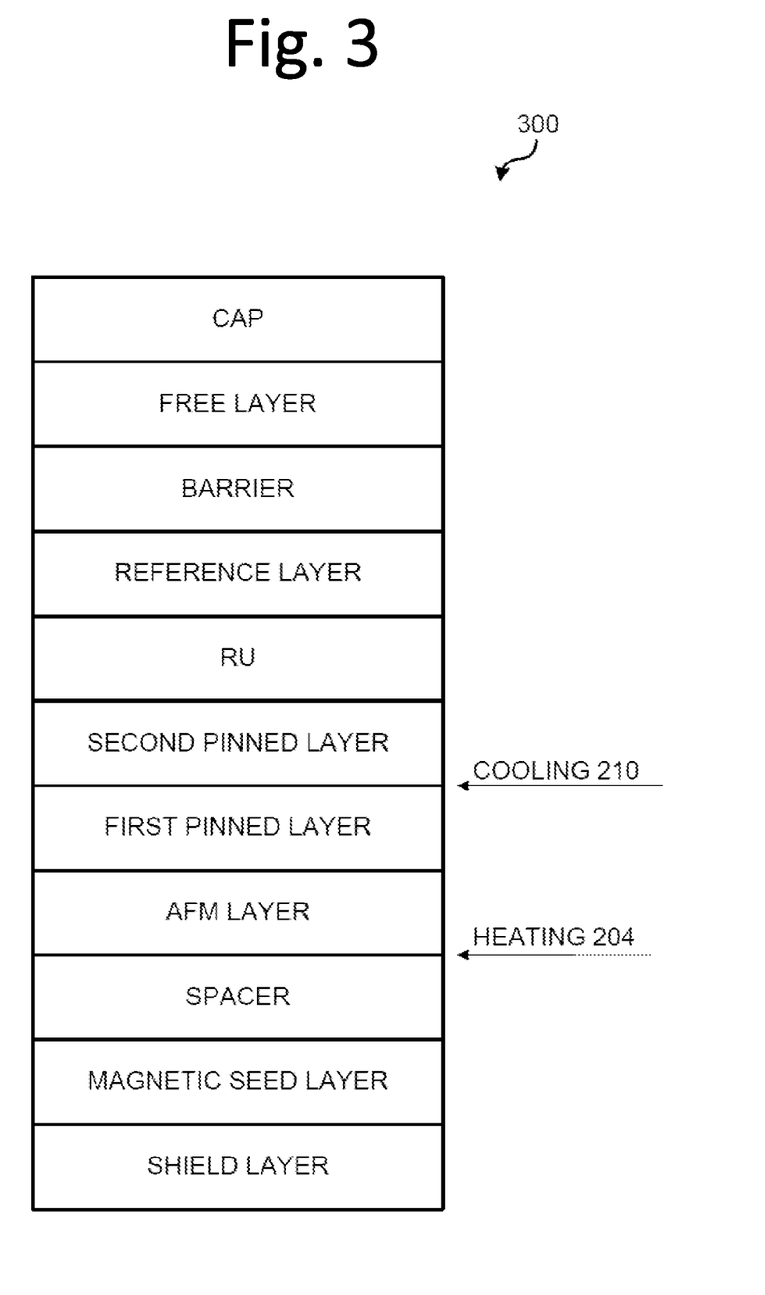
FIG. 3 illustrates an example magnetic recording sensor structure manufactured in accordance with various embodiments.

FIG. 3 illustrates a TMR stack 300 that may be manufactured utilizing process 200 of FIG. 2 in accordance with the present disclosure. TMR stack 300 may include a shield layer, a seed layer, a spacer, an AFM layer, a first pinned layer, a second pinned layer, a Ruthenium (Ru) spacer, a reference layer, a barrier, a free layer and a cap layer. In one embodiment, the AFM layer comprises Iridium Manganese (IrMn).

As illustrated in FIG. 3, the substrate is heated prior to depositing the AFM layer as described above at operation 204 of FIG. 2. In accordance with various embodiments, the substrate may be heated at temperatures ranging from 100° C. to 300° C. In one embodiment, heating can be performed by a resistive process. In another embodiment the heating can be accomplished using a rapid thermal process. In one embodiment, heating may be performed in the same chamber that the AFM layer is deposited. In an alternative embodiment, TMR stack 300 can be transferred to another chamber after heating of the substrate and before deposition of the AFM layer. During deposition of the AFM layer, TMR stack 300 can be maintained at approximately the temperature that the substrate was heated.

After deposition of the AFM layer at the heating temperature, the first pinned layer is deposited. A cooling process may then be performed as described above at operation 210 of FIG. 2. Cooling can occur at temperatures ranging between −222° C. to −2° C. In one embodiment, the temperature of TMR stack 300 is less than 101° C. after cooling.

Table 1 illustrates the performance characteristics of a TMR reader manufactured using two conventional processes versus a TMR reader manufactured using the process disclosed in the present disclosure. The operations of each process are illustrated from left to right under the "Structure" heading. In the disclosed process, a second pinned layer (P1$b$) is formed in addition to the first pinned layer (P1$a$).

TABLE 1

| Structure | | | | | | | Bi-layer | | | MOKE | | CIPT | |
| --- | --- | --- | --- | --- | --- | --- | --- | --- | --- | --- | --- | --- | --- |
| Heat | AFM | Heat | Cool | Pla | Cool | Plb | Hcp | Hex | Tbd_50% | H's | Hex | RA | MR |
| No | Y | No | No | Y | N | N | 478 | 1954 | 245 | 3508 | 5546 | 0.46 | 78 |
| No | Y | Yes | Yes | Y | N | N | 591 | 2863 | 240 | 3690 | 6082 | 0.42 | 73 |
| Yes | Y | No | No | Y | Y | Y | 808 | 2982 | 288 | 4043 | 6924 | 0.44 | 87 |

Figure 4:
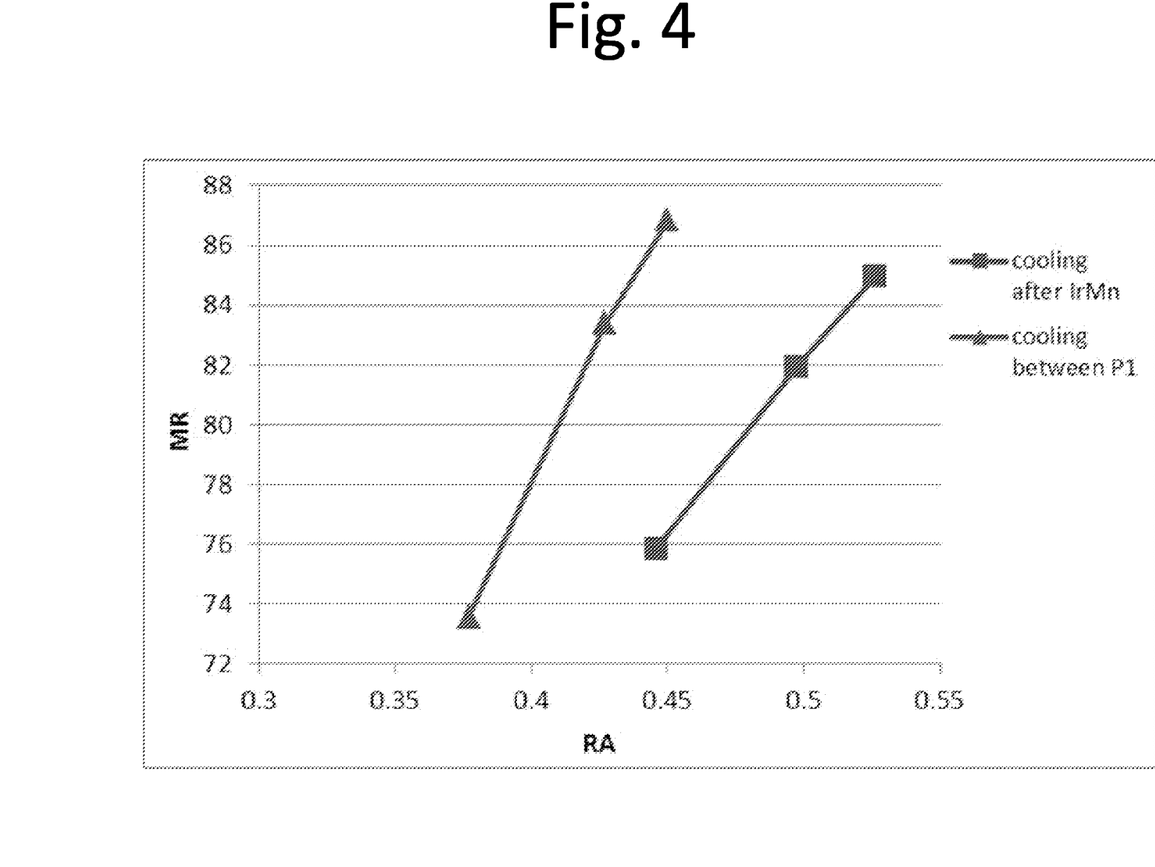
FIG. 4 is an example graph indicative of magnetoresistance (MR) as a function of resistance area (RA) for a recording sensor manufactured in accordance with various embodiments.

As illustrated in Table 1, the disclosed process manufactures a TMR reader with an improved bi-layer performance, showing a higher pinned layer coercivity (Hcp), higher pinning magnetic field strength (Hex), and higher blocking temperature distribution (Tbd) than prior conventional processes. The TMR reader manufactured in accordance with the process disclosed herein also shows an improved full stack exchange bias (H's). As illustrated in FIG. 4, the TMR reader also shows an improved magnetoresistance (MR) as a function of the resistance area (RA). Such improvements are evidenced, as indicated in Table 1, by the Magneto Optical Kerr Effect (MOKE) which describes changes to light reflected from a magnetized surface and therefore indicative of the magnetization structure of a material, as well as Current In Plane Tunneling (CIPT) for measuring the properties of a tunnel junction.

Figure 5:
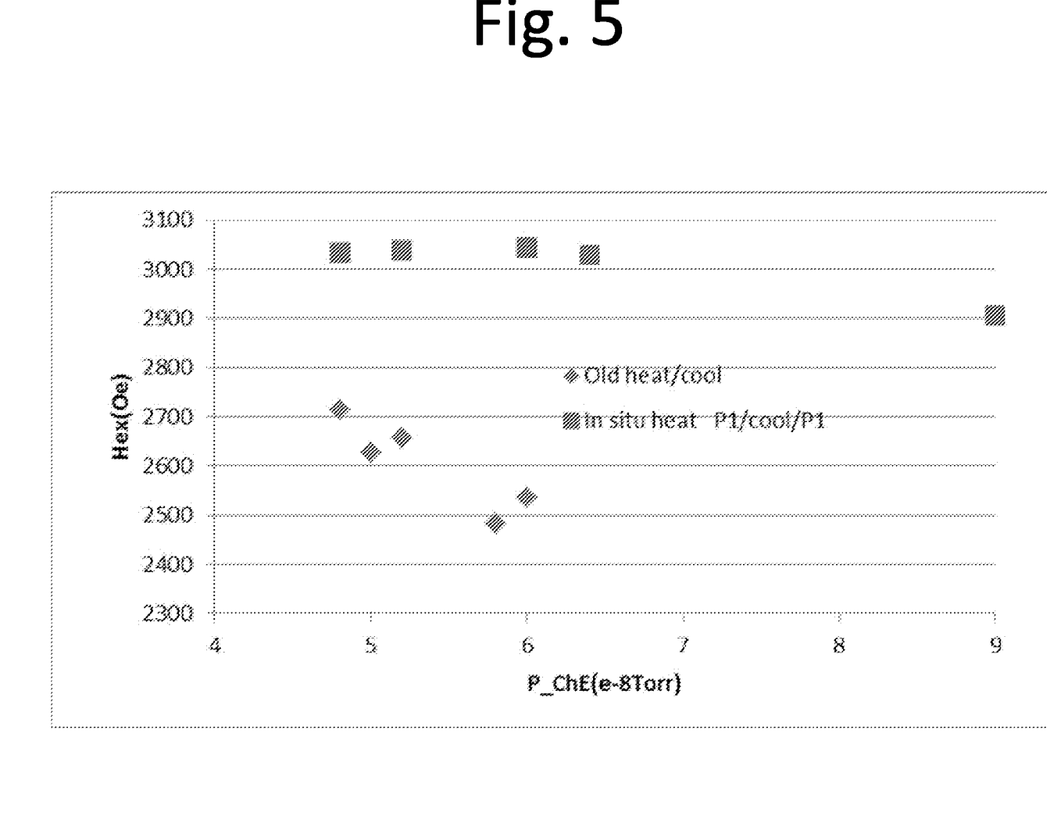
FIG. 5 is an example graph indicative of the dependence of pinning magnetic field strength ($H_{ex}$) on incoming wafer degas pressure.

Table 2 and FIG. 5 illustrate the pinning dependence of the wafer at different wafer degas pressures (p_ChE) in units of e*$10^{-8}$ Torr for the TMR reader of the present disclosure and the conventional heat and cool after AFM deposition TMR reader. As illustrated in Table 2, the conventional TMR reader's coercivity and pinning magnetic field strength is highly dependent on the degas pressure. By contrast, the coercivity and pinning magnetic field strength of the TMR reader of the present disclosure has little dependence on the degas pressure.

TABLE 2

| Process | Wafer ID | Hcp | Hex | p_ChE(e-8Torr) |
| --- | --- | --- | --- | --- |
| Old heat/cool | Wafer 1 | 612 | −2715 | 4.8 |
| | Wafer 2 | 605 | −2657 | 5.2 |
| | Wafer 3 | 573 | −2626 | 5 |
| | Wafer 4 | 513 | −2481 | 5.8 |
| | Wafer 5 | 567 | −2535 | 6 |

TABLE 2-continued

| Process | Wafer ID | Hcp | Hex | p_ChE(e-8Torr) |
| --- | --- | --- | --- | --- |
| In situ heat P1/cool/P1 | Wafer 6 | 743 | −3034 | 4.8 |
| | Wafer 7 | 746 | −3038 | 5.2 |
| | Wafer 8 | 751 | −3043 | 6 |
| | Wafer 9 | 751 | −3030 | 6.4 |
| | Wafer 10 | 750 | −2906 | 9 |

The system and process for manufacturing a TMR reader provides many benefits. First, it improves the pinning strength of the TMR reader. Second, it improves the blocking temperature distribution. This in turn may improve the TMR device reliability and allow for a reduction of the thickness of the IrMn AFM layer. In one embodiment, the thickness of the layer may be reduced to 50 angstroms. Third, the in-coming wafer degas effect is substantially reduced. Fourth, due to the heating treatment prior to the AFM layer deposition, the illustrated process produces a smoother film than prior processes. It should be noted that although various embodiments described herein have been presented in the context of a TMR sensor, the systems and methods of manufacturing a recording sensor are contemplated to be applicable to other sensors, such as a current perpendicular to plane-giant magnetoresistance (CPP-GMR) sensor, to Magnetic Random Access Memory (MRAM) or other types of magnetic sensing or memory devices.

Although described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the application, whether or not such embodiments are described and whether or not such features are presented as being a part of a described embodiment. Thus, the breadth and scope of the present application should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method for manufacturing a magnetic device on a substrate, comprising:
   heating the substrate in a first chamber;
   depositing an antiferromagnetic (AFM) layer on the heated substrate;
   adding a first pinned layer on the AFM layer; and
   cooling the substrate after adding the first pinned layer.

2. The method of claim 1, wherein prior to heating, the substrate comprises:
   a shield layer;
   a magnetic seed layer on the shield layer; and
   a spacer on the magnetic seed layer.

3. The method of claim 1, wherein the heated substrate is maintained at an approximately constant temperature during the operation of depositing the AFM layer.

4. The method of claim 3, wherein the substrate is heated in the first chamber to a temperature between 100° C. and 300° C.

5. The method of claim 4, wherein the temperature of the substrate is less than 100° C. after cooling the substrate.

6. The method of claim 5, wherein the operation of cooling provides lower interlayer diffusion between the first pinned layer and the second pinned layer.

7. The method of claim 4, wherein the substrate is heated using a resistive process.

8. The method of claim 4, wherein the substrate is heated using a rapid thermal process.

9. The method of claim 4, wherein the AFM layer is deposited in the first chamber that the substrate is heated.

10. The method of claim 4, wherein the substrate is moved to a second chamber prior to performing the operation of depositing the AFM layer.

11. The method of claim 1, further comprising adding a second pinned layer on the first pinned layer after cooling the substrate.

* * * * *